US012805258B2

(12) United States Patent
Choi et al.

(10) Patent No.: US 12,805,258 B2
(45) Date of Patent: Nov. 17, 2026

(54) ELECTROSTATIC CHUCK ASSEMBLY AND SEMICONDUCTOR MANUFACTURING APPARATUS INCLUDING THE SAME

(71) Applicant: Samsung Electronics Co., Ltd., Suwon-si (KR)

(72) Inventors: Hyun Sun Choi, Suwon-si (KR); Huijong Cheong, Suwon-si (KR); Minjae Na, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 127 days.

(21) Appl. No.: 19/060,209

(22) Filed: Feb. 21, 2025

(65) Prior Publication Data

US 2026/0052946 A1 Feb. 19, 2026

(30) Foreign Application Priority Data

Aug. 19, 2024 (KR) ........................ 10-2024-0110774

(51) Int. Cl.
*H10P 72/72* (2026.01)
*H01J 37/32* (2006.01)

(52) U.S. Cl.
CPC ...... *H10P 72/722* (2026.01); *H01J 37/32477* (2013.01); *H01J 37/32724* (2013.01); *H01J 2237/0206* (2013.01)

(58) Field of Classification Search
CPC ............... H01P 72/722; H01J 37/32477; H01J 37/32724; H01J 2237/0206
See application file for complete search history.

(56) References Cited

U.S. PATENT DOCUMENTS

| | | | | |
|---|---|---|---|---|
| 10,468,235 | B2 | 11/2019 | Sun et al. | |
| 11,004,716 | B2 * | 5/2021 | Yang | H01J 37/32642 |
| 11,848,176 | B2 | 12/2023 | Dorf et al. | |
| 2013/0279066 | A1 | 10/2013 | Lubomirsky et al. | |
| 2016/0035610 | A1 * | 2/2016 | Park | H01J 37/32568 165/80.2 |
| 2019/0013230 | A1 | 1/2019 | Taga et al. | |
| 2019/0019654 | A1 | 1/2019 | Kobayashi | |
| 2021/0111057 | A1 | 4/2021 | Lee et al. | |
| 2024/0062997 | A1 | 2/2024 | Hazarika et al. | |

* cited by examiner

*Primary Examiner* — Adolf D Berhane
(74) *Attorney, Agent, or Firm* — Muir Patent Law, PLLC

(57) ABSTRACT

An electrostatic chuck assembly includes an upper electrostatic chuck including an upper surface on which a wafer is adsorbed, a lower electrostatic chuck disposed below the upper electrostatic chuck and supporting the upper electrostatic chuck, a base disposed below the lower electrostatic chuck and supporting the lower electrostatic chuck, and a coating layer including an upper surface portion disposed on an upper surface of the lower electrostatic chuck, a side portion disposed on a side surface of the lower electrostatic chuck, and a bottom portion disposed on a part of a lower surface of the lower electrostatic chuck, wherein the lower surface of the lower electrostatic chuck includes a first surface in contact with an upper surface of the base, and a second surface spaced apart from an upper surface of the base, and the bottom portion is disposed horizontally apart from the first surface.

20 Claims, 10 Drawing Sheets

ELECTROSTATIC CHUCK ASSEMBLY AND SEMICONDUCTOR MANUFACTURING APPARATUS INCLUDING THE SAME

CROSS-REFERENCE TO RELATED APPLICATION

This application claims priority under 35 U.S.C. § 119 to Korean Patent Application No. 10-2024-0110774, filed in the Korean Intellectual Property Office on Aug. 19, 2024, the entire contents of which are hereby incorporated by reference.

BACKGROUND

Field

Aspects of embodiments of the present disclosure relate to an electrostatic chuck assembly and a semiconductor manufacturing apparatus including the same.

Description of Related Art

Semiconductor devices may be manufactured through a variety of processes. For example, semiconductor devices may be manufactured through photo processes, etching processes, deposition processes, etc. on wafers such as silicon. In these processes, various fluids may be used. For example, plasma may be used in etching processes and/or deposition processes. Electrodes may be used to form and/or control plasma during the process.

In the process of manufacturing semiconductors using plasma, damage may occur to a semiconductor manufacturing apparatus. For example, if an electric field is concentrated at a specific point on the electrostatic chuck where the wafer is loaded, arcing may occur. Because the semiconductor manufacturing apparatus is damaged by the arcing phenomenon, it is desirable to prevent the arcing phenomenon.

SUMMARY

The present disclosure has been proposed to solve the above technical problems, and aspects of embodiments of the present disclosure are to provide an electrostatic chuck assembly capable of preventing arcing damage.

The present disclosure has been proposed to solve the above technical problems, and aspects of embodiments of the present disclosure are to provide a semiconductor manufacturing apparatus capable of preventing arcing damage.

According to some embodiments of the present disclosure, an electrostatic chuck assembly may include an upper surface on which a wafer is adsorbed, a lower electrostatic chuck disposed below the upper electrostatic chuck and supporting the upper electrostatic chuck, a base disposed below the lower electrostatic chuck and supporting the lower electrostatic chuck, and a coating layer including an upper surface portion disposed on an upper surface of the lower electrostatic chuck, a side portion disposed on a side surface of the lower electrostatic chuck, and a bottom portion disposed on a part of a lower surface of the lower electrostatic chuck, wherein the lower surface of the lower electrostatic chuck includes a first surface in contact with an upper surface of the base, and a second surface, on which the bottom portion is disposed, spaced apart from an upper surface of the base, and wherein the bottom portion is disposed horizontally apart from the first surface.

According to some embodiments of the present disclosure, an electrostatic chuck assembly may include a lower electrostatic chuck, a coating layer covering a part of the lower electrostatic chuck, an adhesive layer formed on the coating layer, a heater dielectric layer formed on the adhesive layer, an electrostatic dielectric layer, to which a wafer is adsorbed, formed on the heater dielectric layer, and a base disposed on a lower surface of the lower electrostatic chuck, wherein the lower electrostatic chuck includes a protrusion protruding toward the base and in contact with an upper surface of the base, and wherein the coating layer is disposed between the lower surface of the lower electrostatic chuck and the upper surface of the base, and includes a bottom portion surrounding the protrusion.

According to some embodiments of the present disclosure, a semiconductor manufacturing apparatus may include a chamber in which a plasma process is performed, an electrostatic chuck assembly disposed inside the chamber and configured to support a wafer, and a control unit configured to control the electrostatic chuck assembly, wherein the electrostatic chuck assembly comprises an upper electrostatic chuck including an upper surface on which the wafer is adsorbed, a lower electrostatic chuck disposed below the upper electrostatic chuck and supporting the upper electrostatic chuck, a base disposed below the lower electrostatic chuck and supporting the lower electrostatic chuck, and a coating layer including an upper surface portion disposed on an upper surface of the lower electrostatic chuck, a side portion disposed on a side surface of the lower electrostatic chuck, and a bottom portion disposed on a part of a lower surface of the lower electrostatic chuck, wherein the lower surface of the lower electrostatic chuck includes a first surface in contact with an upper surface of the base, and a second surface, on which the bottom portion is disposed, spaced apart from an upper surface of the base, and wherein the bottom portion is disposed horizontally apart from the first surface.

According to some embodiments of the present disclosure, a cavity may be formed between an edge of a bottom portion of a coating layer and a protrusion of a lower electrostatic chuck. The cavity may prevent arcing damage of the coating layer by forming a current path which is connected from the lower electrostatic chuck to the base.

According to some embodiments of the present disclosure, the bottom portion of the coating layer and the upper surface of the base may be spaced apart from each other, so that damage to the coating layer may be prevented even when the lower electrostatic chuck is distorted. Accordingly, arcing damage to the coating layer may be prevented.

According to some embodiments of the present disclosure, as an insulating structure, which covers the edge of the bottom portion of the coating layer, is formed, a current path, which is connected from the edge of the bottom portion to an insulating structure, may be blocked. Accordingly, arcing damage occurring at the bottom portion of the coating layer may be prevented.

BRIEF DESCRIPTION OF DRAWINGS

The above and other embodiments and features of the present disclosure will become more apparent by describing in detail example embodiments thereof with reference to the attached drawings, in which.

DETAILED DESCRIPTION

Figure 1:
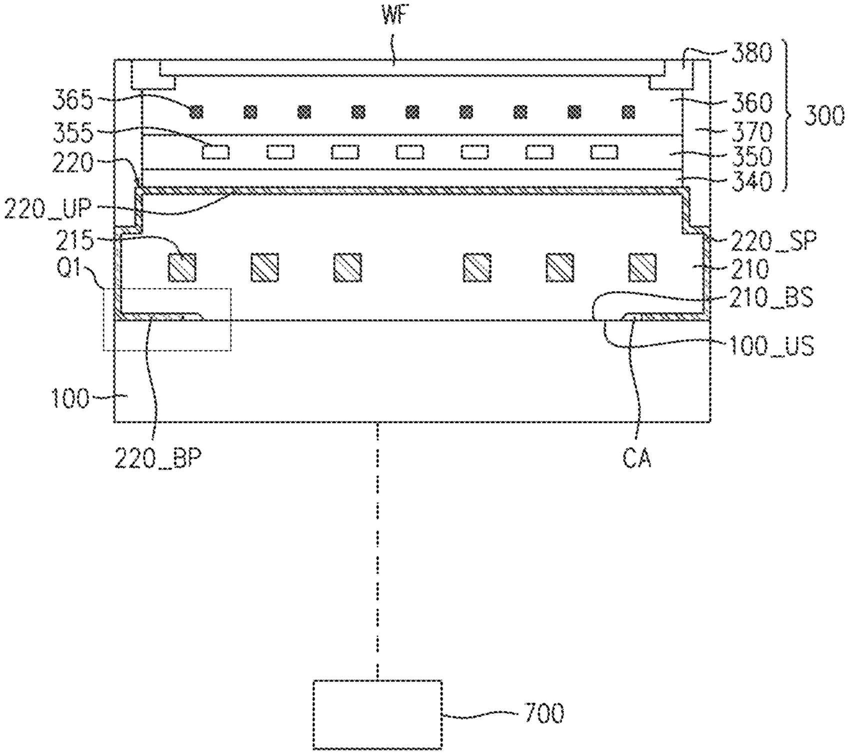
FIG. 1 is an exemplary view illustrating an electrostatic chuck assembly according to some embodiments of the present disclosure.

Hereinafter, an electrostatic chuck assembly and a semiconductor manufacturing apparatus including the same according to some embodiments of the present disclosure will be described in detail with reference to drawings. Like reference characters refer to like elements throughout.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

Figure 2:
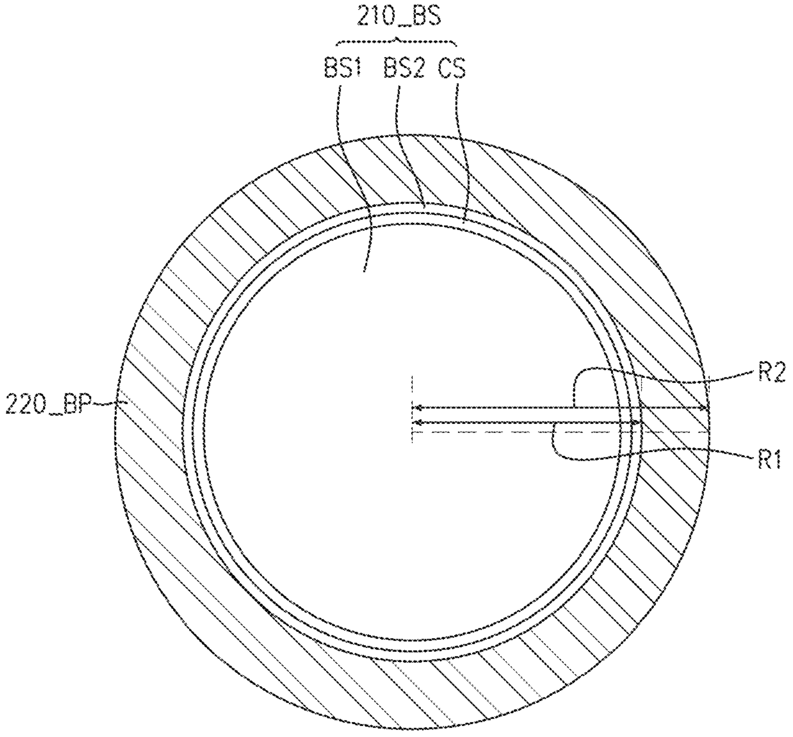
FIG. 2 is a view illustrating a base and a coating layer of FIG. 1.
Figure 3:
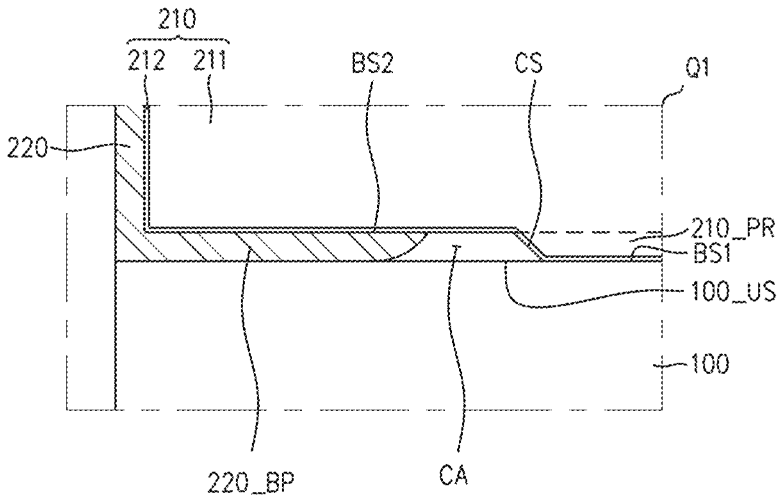
FIGS. 3 and 4 are enlarged views illustrating area Q1 of FIG. 1.
Figure 4:
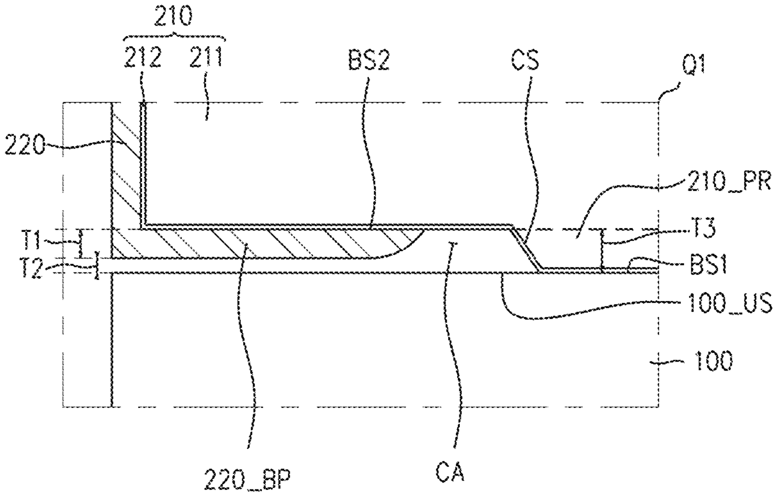

FIG. 1 is an exemplary view illustrating an electrostatic chuck assembly according to some embodiments of the present disclosure. FIG. 2 is a view illustrating a base and a coating layer of FIG. 1. FIGS. 3 and 4 are enlarged views illustrating area Q1 of FIG. 1.

Referring to FIGS. 1 to 4, an electrostatic chuck assembly according to some embodiments may include a base 100, a lower electrostatic chuck 210, a coating layer 220, an upper electrostatic chuck 300, and a control unit 700.

The upper electrostatic chuck 300 may include an adhesive layer 340, a heater dielectric layer 350, an electrostatic dielectric layer 360, an outer ring 370, and a focus ring 380. A wafer WF may be loaded onto the upper surface of the upper electrostatic chuck 300.

The adhesive layer 340 may be disposed on the upper surface of the coating layer 220. For example, the adhesive layer 340 may contact the upper surface of the coating layer 220. The adhesive layer 340 may allow the coating layer 220 to adhere to the heater dielectric layer 350. Although the adhesive layer 340 is shown as being a single layer, the present disclosure is not limited thereto. For example, the adhesive layer 340 may be a multilayer structure including a first adhesive, a second adhesive, and a metal plate disposed between the first adhesive and the second adhesive.

The heater dielectric layer 350 may be disposed on the adhesive layer 340. For example, the heater dielectric layer 350 may contact an upper surface of the adhesive layer 340. The heater dielectric layer 350 may include an embedded heater electrode 355. The heater dielectric layer 350 may surround the embedded heater electrode 355. The heater dielectric layer 350 may be composed of a dielectric such as a ceramic, for example, an aluminum oxide layer ($Al_2O_3$), an aluminum nitride layer (AlN), an yttrium oxide layer ($Y_2O_3$), or a resin, for example, polyimide. The heater dielectric layer 350 may be circular or disk-shaped. The diameter of the heater dielectric layer 350 may be equal to or substantially the same as the diameter of its adjacent electrostatic dielectric layer 360.

The heater electrode 355 may be composed of a conductor, for example, a metal such as tungsten (W), copper (Cu), nickel (Ni), molybdenum (Mo), titanium (Ti), a nickel-chromium alloy (Ni—Cr alloy), or a nickel-aluminum alloy (Ni—Al alloy), or a conductive ceramic such as tungsten carbide (WC), molybdenum carbide (MoC), or titanium nitride (TiN).

The heater electrode 355 may be electrically connected to a heater power source of the control unit 700. The heater electrode 355 may be heated by power, such as an AC voltage, from a heater power source, so that the temperature of the upper electrostatic chuck 300 and the wafer WF may be controlled. The heater electrode 355 may have a concentrical or spiral pattern based on the central axis of the heater dielectric layer 350.

The electrostatic dielectric layer 360 may be disposed on the heater dielectric layer 350. The electrostatic dielectric layer 360 may include an embedded adsorption electrode 365. The electrostatic dielectric layer 360 may surround the embedded adsorption electrode 365. The adsorption electrode 365 may be referred to as a clamp electrode. The electrostatic dielectric layer 360 may be composed of a dielectric such as a ceramic, for example, an aluminum oxide layer ($Al_2O_3$), an aluminum nitride layer (AlN), an yttrium oxide layer ($Y_2O_3$), or a resin, for example, polyimide. The electrostatic dielectric layer 360 may be circular or disk-shaped.

The electrostatic dielectric layer 360 may include a first part on which the wafer WF is seated and a second part disposed below the first part and in contact with the heater dielectric layer 350. Each of the first and second parts of the electrostatic dielectric layer 360 may have a circular shape or a disk shape. The diameter of the first part of the electrostatic dielectric layer 360 may be smaller than the diameter of the wafer WF. The diameter of the second part of the electrostatic dielectric layer 360 may be larger than the diameter of the wafer WF. For example, when the diameter of the wafer WF is about 300 mm, the diameter of the first part of the electrostatic dielectric layer 360 may be about 296 mm to 299 mm, and the diameter of the second part of the electrostatic dielectric layer 360 may be about 297 mm to 340 mm.

Because the diameter of the first part of the electrostatic dielectric layer 360 is smaller than the diameter of the wafer WF, the upper surface of the electrostatic dielectric layer 360 may be completely covered by the wafer WF. Because the first part of the electrostatic dielectric layer 360 is covered by the wafer WF, damage that may be caused by the plasma process treatment may be prevented.

The adsorption electrode 365 may be disposed within the electrostatic dielectric layer 360. The adsorption electrode 365 may be composed of a conductor, for example, a metal such as tungsten (W), copper (Cu), nickel (Ni), molybdenum (Mo), nickel-chromium alloy (Ni—Cr alloy), or nickel-aluminum alloy (Ni—Al alloy), or a conductive ceramic such as tungsten carbide (WC), molybdenum carbide (MoC), or titanium nitride (TiN).

The adsorption electrode 365 may be electrically connected to the electrostatic chuck power source (ESC power source) of the control unit 700. An electrostatic force may be generated between the adsorption electrode 365 and the wafer WF by power applied from an electrostatic chuck power source, such as a direct current voltage, so that the wafer WF may be adsorbed on the electrostatic dielectric layer 360.

In some embodiments, a heat distribution layer may be disposed between the heater dielectric layer 350 and the electrostatic dielectric layer 360. The heat distribution layer may include an aluminum nitride layer, a boron nitride layer, a tungsten layer, a molybdenum layer, or the like, having a thermal conductivity of about 10 W/mK or more. The heat distribution layer may more evenly distribute the heat generated from the heater electrode 355.

The adsorption electrode 365 and the heater electrode 355 should not have an electrical short circuit. The electrical resistance between the adsorption electrode 365 and the heater electrode 355 may be about 1 k Ω or more. In other words, the electrostatic dielectric layer 360, the heater dielectric layer 350, and the heat distribution layer may include a material that enables the electrical resistance between the adsorption electrode 365 and the heater electrode 355 to be at least about 1 kΩ.

The focus ring 380 may be disposed on the electrostatic dielectric layer 360. For example, the focus ring 380 may contact an upper surface of the second part of the electrostatic dielectric layer 360. The focus ring 380 may be coupled to a step disposed on the upper portion of the electrostatic dielectric layer 360. The focus ring 380 may have a ring shape extending along the circumference of a wafer WF loaded on the electrostatic dielectric layer 360. A focus ring 380 may be provided to improve the uniformity of wafer processing, such as plasma etching. The focus ring 380 may include a material having a dielectric constant of 3 or less or a resistivity of 100 Ωcm or less.

The focus ring 380 may include, for example, quartz, aluminum oxide ($Al_2O_3$), yttrium oxide ($Y_2O_3$), silicon (Si), silicon carbide (SiC), carbon (C), silicon oxide ($SiO_2$), etc.

The outer ring 370 may form the outer surface of the upper electrostatic chuck 300. The outer ring 370 may surround the focus ring 380, the electrostatic dielectric layer 360, the heater dielectric layer 350, and the adhesive layer 340. For example, the outer ring 370 may contact side surfaces of the focus ring 380, the electrostatic dielectric layer 360, the heater dielectric layer 350, and the adhesive layer 340. In some embodiments, the outer ring 370 may surround a part of the upper portion of the lower electrostatic chuck 210. For example, the outer ring 370 may horizontally overlap the lower electrostatic chuck 210 and the coating layer 220, and may contact at least a side surface of the coating layer 220. The outer ring 370 may shield the outer wall of the upper electrostatic chuck 300. The outer ring 370 may be composed of the same or similar material as a material of the focus ring 380.

The lower electrostatic chuck 210 may be disposed on the lower side of the upper electrostatic chuck 300. In some embodiments, the lower electrostatic chuck 210 may include a metal body 211 and an anodizing layer 212. An anodizing layer 212 may surround the metal body 211. The anodizing layer 212 may form the outer surface of the lower electrostatic chuck 210.

The metal body 211 may include a metal such as aluminum (Al), titanium (Ti), stainless steel, tungsten (W), or an alloy thereof. The anodizing layer 212 may include, for example, a metal oxide layer.

The coating layer 220 may be disposed between the lower electrostatic chuck 210 and the upper electrostatic chuck 300. Specifically, a part of the coating layer 200 may be disposed between the upper surface of the lower electrostatic chuck 210 and the lower surface of the adhesive layer 340. The lower electrostatic chuck 210 may not contact the upper electrostatic chuck 300 due to the coating layer 200. The coating layer 220 may cover at least a part of the lower electrostatic chuck 210.

The coating layer 220 may include an upper surface portion 220_UP disposed on the upper surface of the lower electrostatic chuck 210, a side portion 220_SP disposed on the side surface of the lower electrostatic chuck 210, and a bottom portion 220_BP disposed on a part of the lower surface 210_BS of the lower electrostatic chuck 210.

The upper surface portion 220_UP may cover the upper surface of the lower electrostatic chuck 210. For example, the upper surface portion 220_UP may extend along the upper surface of the lower electrostatic chuck 210 to completely cover the upper surface. The side portion 220_SP may cover the side surface of the lower electrostatic chuck 210. For example, the side portion 220_SP may extend along the side surface of the lower electrostatic chuck 210 to completely cover the side surface. Specifically, the lower electrostatic chuck 210 may include a step, and the side portion 220_SP may be disposed on the step.

The bottom portion 220_BP may cover a part of the lower surface 210_BS of the lower electrostatic chuck 210. The bottom portion 220_BP may not be disposed on at least a part of the lower surface 210_BS of the lower electrostatic chuck 210. The bottom portion 220_BP may be disposed between the upper surface 100_US of the base 100 and the lower surface 210_BS of the lower electrostatic chuck 210.

In some embodiments, the coating layer 220 may be formed conformally. The thickness of the coating layer 220 may be constant. For example, the thickness of the upper surface portion 220_UP, the thickness of the side portion 220_SP, and the thickness of the bottom portion 220_BP of the coating layer 220 may be the same. Here, the same may mean substantial identicalness including the margin of error in the process. The coating layer 220 may include, for example, aluminum oxide.

Hereinafter, the arrangement of the lower electrostatic chuck 210, the coating layer 220, and the base 100 is described in detail.

The lower surface 210_BS of the lower electrostatic chuck 210 may include a first surface BS1, a second surface BS2, and a connecting surface CS. The first surface BS1 may be a surface in contact with the base 100. The second surface BS2 may be a surface on which the bottom portion 220_BP is disposed. The second surface BS2 may not be in contact with the base 100. The second surface BS2 may be disposed at a higher level than the first surface BS1. The connecting surface CS may connect the first surface BS1 with the second surface BS2. The connecting surface CS may form an angle with the first surface BS1 and an angle with the second surface BS2.

The lower surface 210_BS of the lower electrostatic chuck 210 may include a protrusion 210_PR. The protrusion 210_PR may protrude toward the base 100. A step may be formed on the lower surface 210_BS of the lower electrostatic chuck 210 by the protrusion 210_PR. The protrusion 210_PR may be defined as a first surface BS1 and a connecting surface CS.

The bottom portion 220_BP of the coating layer 220 may have a ring shape, as shown in FIG. 2. For reference, FIG. 2 may be a view illustrating a lower electrostatic chuck 210 and coating layer 220 of FIG. 1 observed from below. The bottom portion 220_BP may be disposed on the second surface BS2. For example, the bottom portion 220_BP may contact the second surface BS2. In some embodiments, the bottom portion 220_BP may cover a part of the second surface BS2 and expose the remaining part of the second surface BS2. The bottom portion 220_BP may not be disposed on the connecting surface CS and the first surface BS1.

The bottom portion 220_BP may have a ring shape including an inner diameter and an outer diameter. The width of the bottom portion 220_BP illustrated in the present disclosure may be illustrated large for convenience of explanation. Here, the width of the bottom portion 220_BP may mean the difference between the outer diameter and the inner diameter of the bottom portion 220_BP. In one embodiment, the inner diameter radius R1 of the bottom portion 220_BP may be 97.5% to 98.5% of the outer diameter radius R2 of the bottom portion 220_BP. In another embodiment, the ratio of the width of the bottom portion 220_BP to the radius of the lower electrostatic chuck 210 may be 30:1 to 35:1. However, the present disclosure is not limited to these examples.

As shown in FIG. 3, the bottom portion 220_BP may be disposed spaced apart from the protrusion 210_PR. For example, the edge of the bottom portion 220_BP may be disposed horizontally apart from the first surface BS1 and the connecting surface CS. The edge of the bottom portion 220_BP may not come into contact with the protrusion 210_PR. Here, the edge of the bottom portion 220_BP may mean a rounded surface disposed at the end of the bottom portion 220_BP. The bottom portion 220_BP may contact the upper surface 100_US of the base 100.

A cavity CA may be formed between the bottom portion 220_BP and the protrusion 210_PR. The cavity CA may mean empty space. The cavity CA may be defined by the edge of the bottom portion 220_BP, the second surface BS2, the connecting surface CS, and the upper surface 100_US of the base (100). The cavity CA may be formed around the protrusion 210_PR. The cavity CA may have a ring shape with a protrusion 210_PR disposed inside. The second surface BS2 may not contact the upper surface 100_US of the base 100 due to the cavity CA. The cavity CA may have a horizontal length (width) that increases from top to bottom.

The electrostatic chuck assembly may be used in a semiconductor manufacturing apparatus that processes wafers WF using plasma. When manufacturing semiconductors using plasma, damage to the electrostatic chuck assembly may occur due to arcing. In particular, arcing may occur intensively at the end of the coating layer 220.

However, in some embodiments of the present disclosure, the electrostatic chuck assembly may have a cavity CA formed between the edge of the bottom portion 220_BP of the coating layer 220 and the protrusion 210_PR of the lower electrostatic chuck 210. The cavity CA may form a current path connected from the lower electrostatic chuck 210 to the base 100, and the current path may be provided as a ground path. Accordingly, the potential difference between the lower electrostatic chuck 210 and the base 100 is eliminated, and arcing damage to the coating layer 220 may be prevented.

In some embodiments, the bottom portion 220_BP may be spaced apart from the upper surface 100_US of the base 100, as in FIG. 4. The bottom portion 220_BP may not contact the upper surface 100_US of the base 100. The cavity CA may be connected to the space between the bottom portion 220_BP and the upper surface 100_US of the base 100.

In some embodiments, the distance T2 between the upper surface 100_US of the base 100 and the bottom portion 220_BP may be smaller than the thickness T1 of the bottom portion 220_BP. Additionally, the thickness T3 of the protrusion 210_PR may be greater than the thickness T1 of the bottom portion 220_BP and the distance T2 between the upper surface 100_US of the base 100 and the bottom portion 220_BP. Here, the thickness of the protrusion 210_PR may be equal to the distance from the upper surface 100_US of the base 100 to the second surface BS2.

When performing a plasma treatment process on a wafer WF using an electrostatic chuck assembly, the lower electrostatic chuck 210 may be distorted. For example, if heat is provided to the lower electrostatic chuck 210, the lower electrostatic chuck 210 may warp. At this time, when the bottom portion 220_BP of the coating layer 220 comes into contact with the upper surface 100_US of the base 100, cracks and/or voids may be formed in the bottom portion 220_BP of the coating layer 220. For example, if a crack is generated, an electric field may be concentrated in the crack, which may cause arcing and damage the electrostatic chuck assembly.

On the other hand, in the electrostatic chuck assembly according to some embodiments of the present disclosure, the bottom portion 220_BP of the coating layer 220 may be disposed spaced apart from the upper surface 100_US of the base 100. Accordingly, even if the lower electrostatic chuck 210 is twisted, damage such as generation of a crack in the bottom portion 220_BP of the coating layer 220 may be prevented.

Referring to FIG. 1, a cooling water channel 215 may be formed inside the lower electrostatic chuck 210. The electrostatic chuck assembly may be used in a plasma processing device that processes wafers WF using plasma. In this case, the interior of the chamber where the electrostatic chuck assembly is installed is created as a high-temperature environment, and when the wafer WF is exposed to high-temperature plasma, damage such as ion bombardment may occur to the wafer WF. In order to avoid damage to the wafer WF and to ensure uniform plasma treatment, cooling of the wafer WF may be required.

In order to cool the wafer WF, the lower electrostatic chuck 210 may further be provided with a cooling water channel 215 through which cooling water flows. For example, the cooling water may include water, ethylene glycol, silicone oil, liquid Teflon, or a mixture of water and glycol. The cooling water channel 215 may have a concentrical or helical pipe structure on the central axis of the lower electrostatic chuck 210.

The cooling water channel 215 may include an inlet through which cooling water flows in and an outlet through which cooling water flows out, and the inlet and outlet may be connected to a temperature adjuster of the control unit 700. The flow speed and temperature of the cooling water circulating in the cooling water channel 215 may be controlled by the temperature adjuster.

The lower electrostatic chuck 210 may be electrically connected to a bias power source of the control unit 700. A high frequency (or radio frequency) is applied from a bias power source to the lower electrostatic chuck 210, and accordingly, the lower electrostatic chuck 210 may act as an electrode for plasma generation.

In some embodiments, the lower electrostatic chuck 210 may further include a temperature sensor. The temperature sensor may transmit the measured temperature of the lower electrostatic chuck 210 to the control unit 700. The temperature of the upper electrostatic chuck 300 may be predicted based on the temperature measured from the temperature sensor. For example, the temperature of the electrostatic dielectric layer 360 or the wafer WF disposed on the electrostatic dielectric layer 360 may be predicted.

The base 100 may be disposed on the lower side of the lower electrostatic chuck 210. The base 100 may support the lower electrostatic chuck 210. A part of the upper surface 100_US of the base 100 may come into contact with the lower surface of the lower electrostatic chuck 210. Specifically, a part of the upper surface 100_US of the base 100 may come into contact with the anodizing layer 212 of the lower electrostatic chuck 210.

The base 100 may be a passage through which the outside of the base 100 is connected to components (e.g., a heater electrode 355, an adsorption electrode 365, a cooling water channel 215, etc.) arranged on the inside the lower electrostatic chuck 210 and the upper electrostatic chuck 300. The base 100 may be circular or disk-shaped. The diameter of the base 100 may be equal to or larger than the diameter of the lower surface 210_BS of the lower electrostatic chuck 210.

Although not illustrated, the control unit 700 can include one or more of the following components: at least one central processing unit (CPU) configured to execute computer program instructions to perform various processes and methods, random access memory (RAM) and read only memory (ROM) configured to access and store data and information and computer program instructions, input/output (I/O) devices configured to provide input and/or output to the control unit 700 (e.g., keyboard, mouse, display, speakers, printers, modems, network cards, etc.), and storage media or other suitable type of memory (e.g., such as, for example, RAM, ROM, programmable read-only memory (PROM), erasable programmable read-only memory (EPROM), electrically erasable programmable read-only memory (EEPROM), magnetic disks, optical disks, floppy disks, hard disks, removable cartridges, flash drives, any type of tangible and non-transitory storage medium) where data and/or instructions can be stored. In addition, the controller can include antennas, network interfaces that provide wireless and/or wire line digital and/or analog interface to one or more networks over one or more network connections (not shown), a power source that provides an appropriate alternating current (AC) or direct current (DC) to power one or more components of the control unit 700, and a bus that allows communication among the various disclosed components of the control unit 700.

The control unit 700 can control the electrostatic chuck power source, the bias power source, the heater power source, and the temperature adjuster. For example, based on the temperature measured from the temperature sensor, the control unit 700 may infer the temperature of the upper electrostatic chuck 300 and/or the wafer WF, and control the power of the heater power source to control the amount of heat generated from the heater electrode 355. Accordingly, the temperature of the upper electrostatic chuck 300 and/or the wafer WF may be appropriately controlled.

Figure 5:
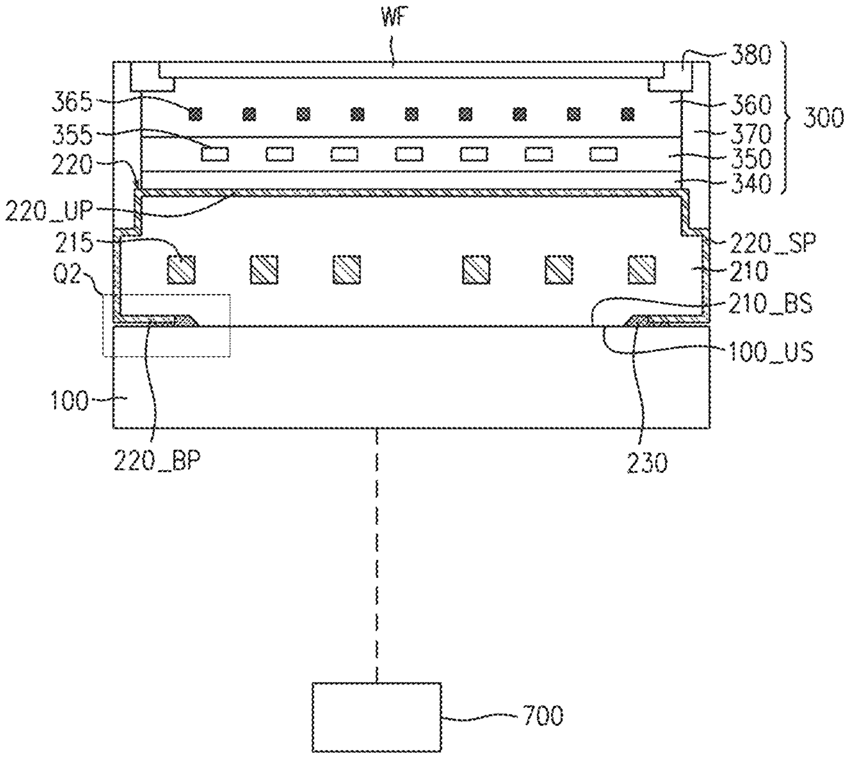
FIG. 5 is an exemplary view illustrating an electrostatic chuck assembly according to some embodiments of the present disclosure.
Figure 6:
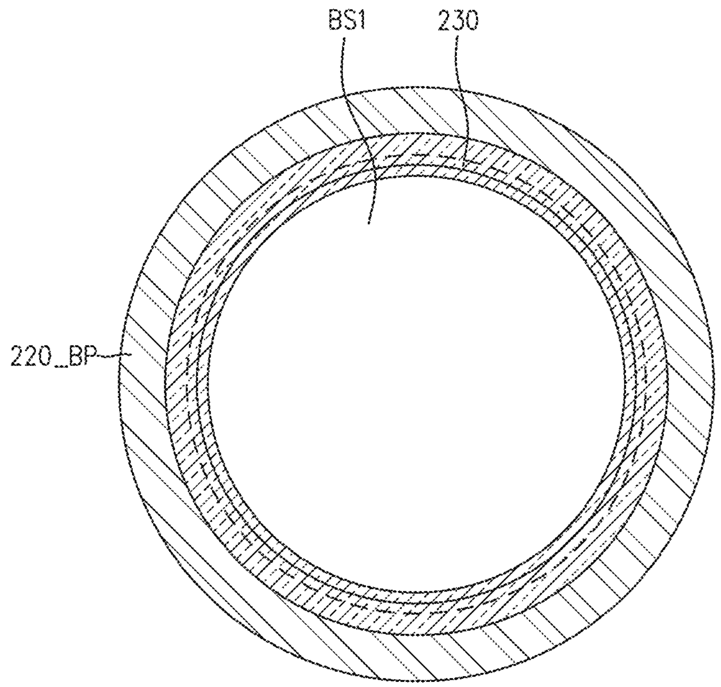
FIG. 6 is a view illustrating the base, the coating layer, and the insulating structure of FIG. 5.
Figure 7:
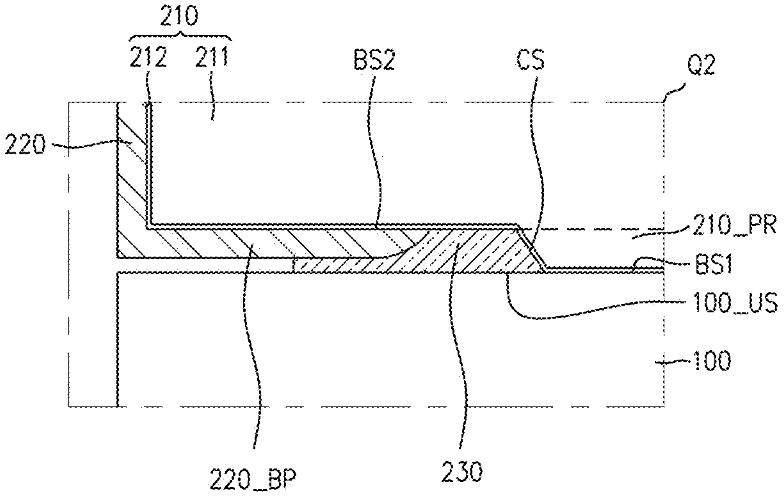
FIGS. 7 and 8 are enlarged views illustrating area Q2 of FIG. 5.
Figure 8:
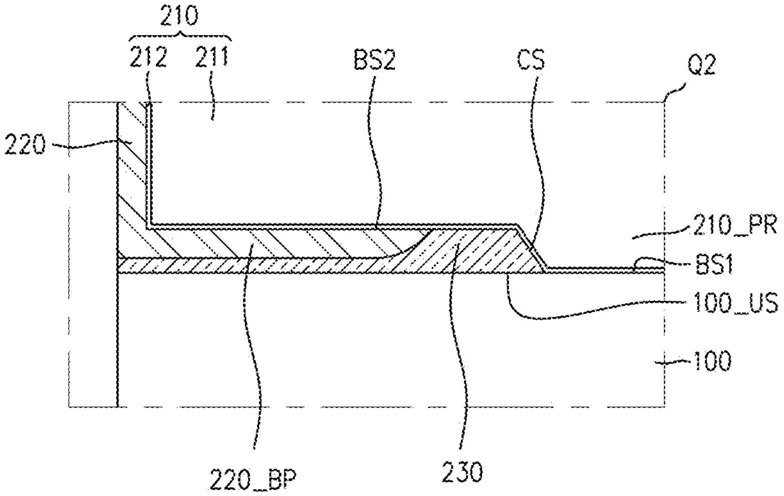

FIG. 5 is an exemplary view illustrating an electrostatic chuck assembly according to some embodiments of the present disclosure. FIG. 6 is a view illustrating the base, the coating layer, and the insulating structure of FIG. 5. FIGS. 7 and 8 are enlarged views illustrating area Q2 of FIG. 5. For convenience of explanation, the explanation will focus on configurations different from those described in FIGS. 1 to 4, and duplicative descriptions may not be repeated.

Referring to FIGS. 5 to 8, an electrostatic chuck assembly according to some embodiments may include a base 100, a lower electrostatic chuck 210, a coating layer 220, an insulating structure 230, an upper electrostatic chuck 300, and a control unit 700.

The upper electrostatic chuck 300 may include an adhesive layer 340, a heater dielectric layer 350, an electrostatic dielectric layer 360, an outer ring 370, and a focus ring 380. A wafer WF may be loaded onto the upper surface of the upper electrostatic chuck 300. The description of the configurations of the upper electrostatic chuck 300 may be the same as described above.

The lower electrostatic chuck 210 may be disposed on the lower side of the upper electrostatic chuck 300. In some embodiments, the lower electrostatic chuck 210 may include a metal body 211 and an anodizing layer 212. An anodizing layer 212 may surround the metal body 211. The anodizing layer 212 may form the outer surface of the lower electrostatic chuck 210.

The coating layer 220 may be disposed between the lower electrostatic chuck 210 and the upper electrostatic chuck 300. Specifically, a part of the coating layer 200 may be disposed between the upper surface of the lower electrostatic chuck 210 and the lower surface of the adhesive layer 340. The coating layer 200 may contact the upper surface of the lower electrostatic chuck 210 and the lower surface of the adhesive layer 340. The lower electrostatic chuck 210 may not contact the upper electrostatic chuck 300 due to the coating layer 200. The coating layer 220 may cover at least a part of the lower electrostatic chuck 210.

The coating layer 220 may include an upper surface portion 220_UP disposed on the upper surface of the lower electrostatic chuck 210, a side portion 220_SP disposed on the side surface of the lower electrostatic chuck 210, and a bottom portion 220_BP disposed on a part of the lower surface 210_BP of the lower electrostatic chuck 210. The description of the upper surface portion 220_UP and the side surface 220_SP of the coating layer 220 may be the same as described above.

The bottom portion 220_BP may cover a part of the lower surface 210_BS of the lower electrostatic chuck 210. The bottom portion 220_BP may not be disposed on at least a part of the lower surface 210_BS of the lower electrostatic chuck 210. The bottom portion 220_BP may be disposed between the upper surface 100_US of the base 100 and the lower surface 210_BS of the lower electrostatic chuck 210.

The lower surface 210_BS of the lower electrostatic chuck 210 may include a first surface BS1, a second surface BS2, and a connecting surface CS. The first surface BS1 may be a surface in contact with the base 100. The second surface BS2 may be a surface on which the bottom portion 220_BP is disposed. For example, the bottom portion 220_BP may contact the second surface BS2 of the lower electrostatic chuck 210. The second surface BS2 may not be in contact with the base 100. The second surface BS2 may be disposed at a higher level than the first surface BS1. The connecting surface CS may connect the first surface BS1 with the second surface BS2. The connecting surface CS may form an angle with the first surface BS1 and an angle with the second surface BS2.

The lower surface 210_BS of the lower electrostatic chuck 210 may include a protrusion 210_PR. The protrusion 210_PR may protrude toward the base 100. A step may be formed on the lower surface 210_BS of the lower electrostatic chuck 210 by the protrusion 210_PR. The protrusion 210_PR may be defined as a first surface BS1 and a connecting surface CS.

The bottom portion 220_BP of the coating layer 220 may have a ring shape, as shown in FIG. 6. For reference, FIG. 6 may be a view illustrating a lower electrostatic chuck 210, coating layer 220, and an insulating structure of FIG. 5 observed from below. The bottom portion 220_BP may be disposed on the second surface BS2. The bottom portion 220_BP may cover a part of the second surface BS2 and expose the remaining part of the second surface BS2. An insulating structure 230 may be disposed in a part of the second surface BS2, in which the bottom portion 220_BP is not disposed. The bottom portion 220_BP may be spaced apart from the upper surface 100_US of the base 100. The bottom portion 220_BP may not contact the upper surface 100_US of the base 100.

The insulating structure 230 may be disposed between the bottom portion 220_BP and the base 100 and between the lower electrostatic chuck 210 and the base 100. Specifically, the insulating structure 230 may be disposed on the second surface BS2, the connection surface CS, the edge of the bottom portion 220_BP, and the upper surface 100_US of the base 100. For example, the insulating structure 230 may contact the second surface BS2, the connection surface CS, the edge of the bottom portion 220_BP, at least a part of the bottom portion 220_BP, and the upper surface 100_US of the base 100. The insulating structure 230 may fill the space between the second surface BS2 and the upper surface 100_US of the base 100. A part of the insulating structure 230 may be disposed between the bottom portion 220_BP and the upper surface 100_US of the base 100.

For example, as shown in FIG. 7, a part of the insulating structure 230 may fill a part of the space between the bottom portion 220_BP and the upper surface 100_US of the base 100. A part of the bottom portion 220_BP and a part of the upper surface 100_US of the base 100 may be exposed. As another example, as shown in FIG. 8, a part of the insulating structure 230 may fill the entire space between the bottom portion 220_BP and the upper surface 100_US of the base 100. The insulating structure 230 may cover a part of the bottom portion 220_BP and the upper surface 100_US of the base 100.

The insulating structure 230 may completely cover the edge of the bottom portion 220_BP. Here, the edge of the bottom portion 220_BP may mean a rounded surface disposed at the end of the bottom portion 220_BP. The insulating structure 230 may include an insulating material. The insulating structure 230 may include, for example, a polymer material having excellent resistivity characteristics. The current path connected from the edge of the bottom portion 220_BP to the insulating structure 230 may be blocked by the insulating structure 230 having excellent resistivity characteristics.

The electrostatic chuck assembly may be used in a semiconductor manufacturing apparatus that processes wafers WF using plasma. When manufacturing semiconductors using plasma, damage to the electrostatic chuck assembly may occur due to arcing. For example, arcing may occur due to voltage concentration in a rounded part, such as the edge part of the coating layer 220.

However, in some embodiments of the present disclosure, the electrostatic chuck assembly may form an insulating structure 230 covering an edge of the bottom portion 220_BP of the coating layer 220, thereby blocking a current path connected from the edge of the bottom portion 220_BP to the insulating structure 230. Accordingly, arcing damage at the edge of the bottom portion 220_BP may be prevented.

Figure 9:
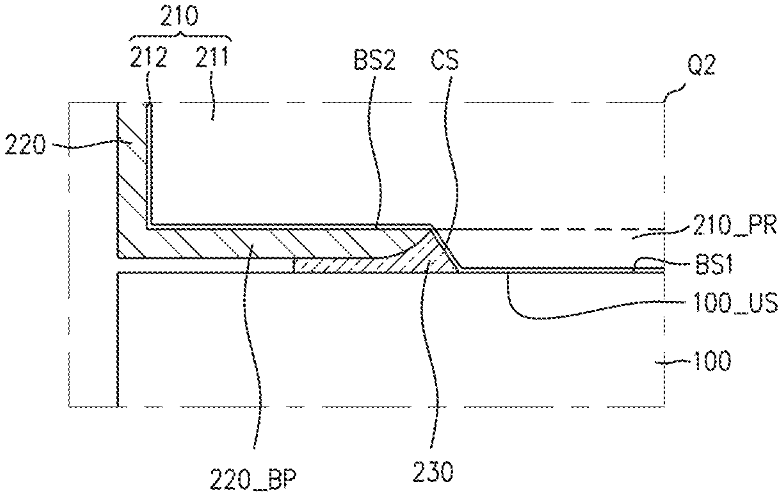
FIG. 9 is a view illustrating an electrostatic chuck assembly according to some embodiments of the present disclosure.

FIG. 9 is a view illustrating an electrostatic chuck assembly according to some embodiments of the present disclosure. For reference, FIG. 9 may correspond to an enlarged view for explaining area Q2 of FIG. 5. For convenience of explanation, the explanation will focus on configurations different from those described in FIGS. 5 to 8.

Referring to FIG. 9, in an electrostatic chuck assembly according to some embodiments, a bottom portion 220_BP of a coating layer 220 may be disposed on a second surface BS2 of a lower electrostatic chuck 210. The bottom portion 220_BP may completely cover the second surface BS2. The insulating structure 230 may be disposed between the edge of the bottom portion 220_BP and the connecting surface CS of the lower electrostatic chuck 210. The insulating structure 230 may be in contact with the edge of the bottom portion 220_BP, the connection surface CS of the lower electrostatic chuck 210, and the upper surface 100_US of the base 100.

A part of the insulating structure 230 may fill a part of the space between the bottom portion 220_BP and the upper surface 100_US of the base 100. A part of the bottom portion 220_BP and a part of the upper surface 100_US of the base 100 may be exposed. However, the present disclosure is not limited to these examples. For example, as shown in FIG. 8, a part of the insulating structure 230 may fill the entire space between the bottom portion 220_BP and the upper surface 100_US of the base 100.

Figure 10:
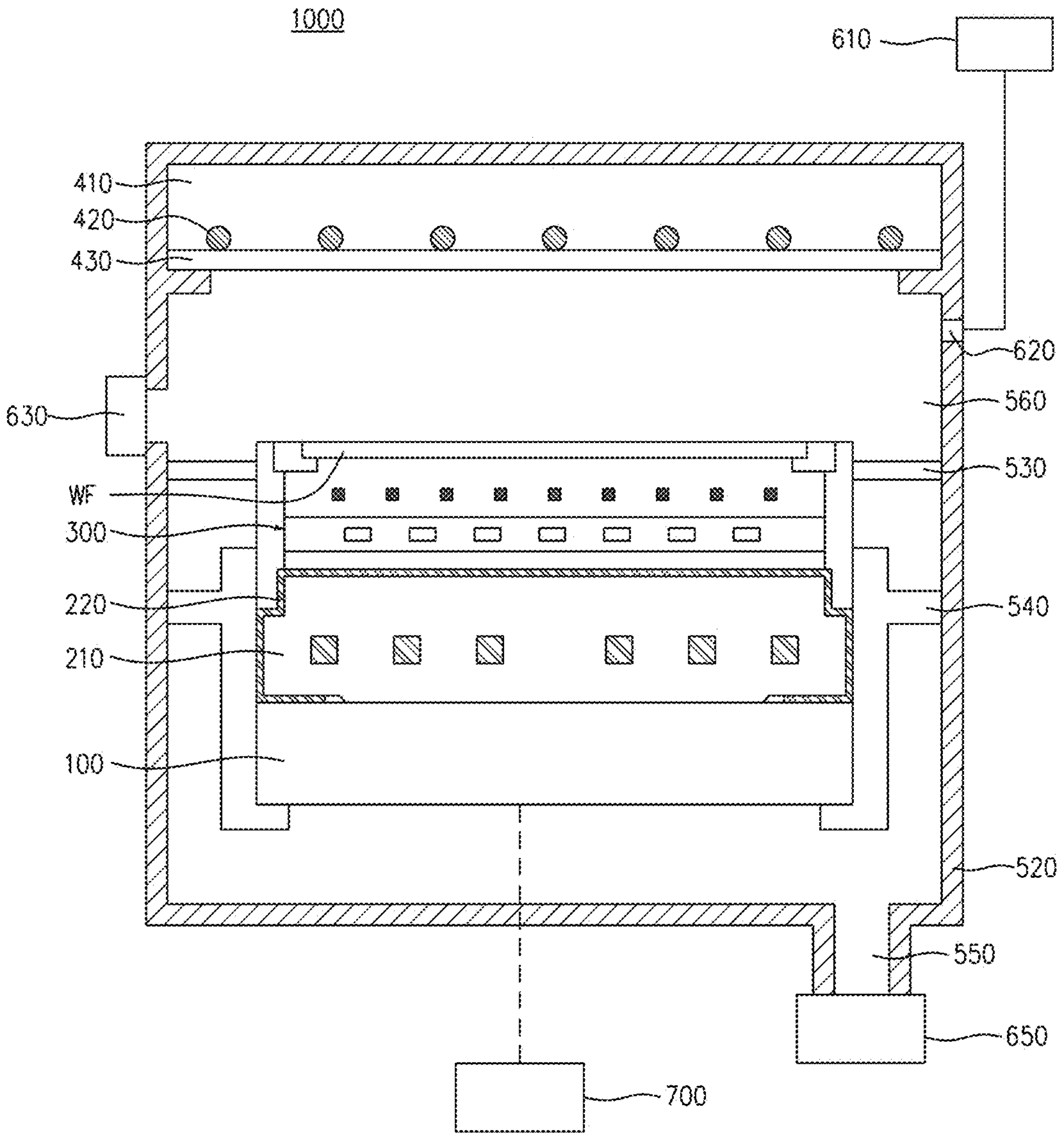
FIG. 10 is a view illustrating a semiconductor manufacturing apparatus according to some embodiments of the present disclosure.

FIG. 10 is a view illustrating a semiconductor manufacturing apparatus according to some embodiments of the present disclosure. For reference, the electrostatic chuck assembly described in FIG. 1 is illustrated in FIG. 10, but this should be construed as exemplary. Unlike the one illustrated, a semiconductor manufacturing apparatus 1000 may include the electrostatic chuck assembly described in FIGS. 1 to 9.

Referring to FIG. 10, a semiconductor manufacturing apparatus 1000 may be an inductively coupled plasma processing device that processes (e.g., plasma-etches) a wafer WF mounted on an electrostatic chuck assembly using plasma (ICP) generated in an inductively coupled manner. The electrostatic chuck assembly may be used in an etching processing device which uses plasma (CCP) generated by a capacitive coupling scheme. The semiconductor manufacturing apparatus 1000 may be equipped with an electrostatic chuck assembly having an upper electrostatic chuck 300 having a wafer WF mounted at the lower center of a cylindrical vacuum chamber 520.

The electrostatic chuck assembly may be connected to a control unit 700. The description of the electrostatic chuck assembly may be the same as that described with reference to FIGS. 1 to 9. Hereinafter, the description of the electrostatic chuck assembly focuses on differences from the above description, and duplicative descriptions may not be repeated.

The electrostatic chuck assembly may be supported by a support portion 540 fixed to the inner wall of the vacuum chamber 520. A baffle plate 530 may be provided between the electrostatic chuck assembly and the inner wall of the vacuum chamber 520. For example, a baffle plate 530 may be formed between the upper electrostatic chuck 300 and the inner wall of the vacuum chamber 520. An exhaust pipe 550 may be provided at the bottom of the vacuum chamber 520. The exhaust pipe 550 may be connected to a vacuum pump 650. The vacuum pump 650 may provide negative pressure to maintain the inside of the vacuum chamber 520 in a vacuum state. A gate valve 630 for opening and closing an opening responsible for loading and unloading a wafer WF may be provided on the outer wall of the vacuum chamber 520. In some embodiments, the support portion 540 may be omitted and the electrostatic chuck assembly may be raised vertically by a lifting device. The lifting device may be controlled by a control unit 700. After the electrostatic chuck assembly is lowered downward by the control unit 700, the wafer WF may be loaded or unloaded. In this case, a gate valve 630 may be provided on the lower outer wall of the vacuum chamber 520.

A dielectric window 430 may be provided on the ceiling of the vacuum chamber 520 and spaced apart from the electrostatic chuck assembly. An antenna room 410 that accommodates a high-frequency antenna 420 in a spiral or concentric coil shape on a dielectric window 430 may be installed integrally with a vacuum chamber 520. The high-frequency antenna 420 may be electrically connected to a high-frequency power source for plasma generation through an impedance matcher. The high-frequency power source may output high frequency power suitable for plasma generation. The impedance matcher may be provided to match the impedance of a high-frequency power source and the impedance of a load, such as a high-frequency antenna 420.

A gas supply source 610 may supply raw gas to the vacuum chamber 520 through a supply device 620 installed on a side wall of the vacuum chamber 520. The supply device 620 may be, for example, a nozzle or a porthole. In some embodiments, a supply device for supplying the raw gas may be installed at the top of the vacuum chamber 520 in the form of a shower head. In order to perform an etching process using a semiconductor manufacturing apparatus 1000, a gate valve 630 may be opened to load (or mount) a wafer WF onto the upper electrostatic chuck 300 within the vacuum chamber 520. A wafer WF may be adsorbed to the upper electrostatic chuck 300 by electrostatic force generated by power application from the electrostatic chuck power source to the upper electrostatic chuck 300.

Etching gas may be introduced into the vacuum chamber 520 from a gas supply source 610. At this time, the pressure inside the vacuum chamber 520 may be set to a set value using a vacuum pump 650. Power from a high-frequency power source may be applied to a high-frequency antenna 420 through an impedance matcher. Additionally, power may be applied from a bias power source to the lower electrostatic chuck 210. The control unit 700 may control a high-frequency power source and a bias power source.

The etching gas introduced into the vacuum chamber 520 may be uniformly diffused in a processing room 560 under the dielectric window 430. A magnetic field is generated around the high-frequency antenna 420 by the current flowing in the high-frequency antenna 420, and magnetic force lines may penetrate the dielectric window 430 and pass through the processing room 560. An induced electric field is generated by a temporal change in the magnetic field, and electrons accelerated by the induced electric field may collide with molecules or atoms of the etching gas to generate plasma.

In this way, wafer processing, that is, the etching process, may be performed in the processing room by supplying plasma ions to the wafer WF using the plasma generation unit. The plasma generation unit may include a gas supply source 610 for supplying a raw gas to a processing room 560, a high-frequency antenna 420 provided in an antenna room 410, and a high-frequency power source for providing high-frequency power to the high-frequency antenna 420.

The above-described electrostatic chuck assembly may be used to manufacture semiconductor devices including logic devices and memory devices, and further processes may be performed on the semiconductor wafer WF to form the semiconductor devices. For example, additional conductive and insulating layers may be deposited on the semiconductor wafer WF to form a plurality of semiconductor chips, and the semiconductor chips may then be singulated, packaged on a package substrate, and encapsulated by an encapsulant to form a semiconductor package. The semiconductor devices may include finFET, DRAM, VNAND, etc. The semiconductor devices may be applied in various systems, such as a computing system.

Although certain embodiments of the present disclosure have been described with reference to the accompanying drawings, those of ordinary skill in the art to which the present disclosure pertains will understand that the present disclosure may be implemented in other specific forms without changing its technical idea or essential features. Therefore, it should be understood that the embodiments described above are illustrative and non-limiting in all respects.

What is claimed is:

1. An electrostatic chuck assembly comprising:

an upper electrostatic chuck comprising an upper surface on which a wafer is adsorbed;

a lower electrostatic chuck disposed below the upper electrostatic chuck and supporting the upper electrostatic chuck;

a base disposed below the lower electrostatic chuck and supporting the lower electrostatic chuck; and a coating layer comprising an upper surface portion disposed on an upper surface of the lower electrostatic chuck, a side portion disposed on a side surface of the lower electrostatic chuck, and a bottom portion disposed on a part of a lower surface of the lower electrostatic chuck, wherein the lower surface of the lower electrostatic chuck comprises a first surface in contact with an upper surface of the base, and a second surface, on which the bottom portion is disposed, spaced apart from an upper surface of the base, and wherein the bottom portion is disposed horizontally apart from the first surface.

2. The electrostatic chuck assembly as claimed in claim 1, wherein the lower surface of the lower electrostatic chuck further comprises a connecting surface connecting the first surface to the second surface, and wherein an edge of the bottom portion is disposed apart from the connecting surface.

3. The electrostatic chuck assembly as claimed in claim 2, wherein a cavity is formed between the lower electrostatic chuck and the base, the cavity being defined by an edge of the bottom portion, the second surface, the connecting surface, and the upper surface of the base.

4. The electrostatic chuck assembly as claimed in claim 1, wherein the second surface is disposed at a higher level than the first surface.

5. The electrostatic chuck assembly as claimed in claim 1, wherein the bottom portion is in contact with the upper surface of the base.

6. The electrostatic chuck assembly as claimed in claim 1, wherein the bottom portion is spaced apart from the upper surface of the base.

7. The electrostatic chuck assembly as claimed in claim 6, wherein a distance from the upper surface of the base to the bottom portion is smaller than a thickness of the bottom portion.

8. The electrostatic chuck assembly as claimed in claim 1, wherein a thickness of the upper surface portion is equal to a thickness of the bottom portion.

9. The electrostatic chuck assembly as claimed in claim 1, further comprising an insulating structure disposed on an edge of the bottom portion, the second surface, and the upper surface of the base.

10. The electrostatic chuck assembly as claimed in claim 1, wherein the lower electrostatic chuck comprises a metal body and an anodizing layer surrounding the metal body.

11. The electrostatic chuck assembly as claimed in claim 1, wherein a cavity is formed between the lower electrostatic chuck and the base, the cavity being defined by an edge of the bottom portion, the second surface, and the upper surface of the base, and wherein the cavity forms a current path connecting the lower electrostatic chuck to the base.

12. The electrostatic chuck assembly as claimed in claim 1, wherein the upper electrostatic chuck comprises an adhesive layer disposed on the upper surface, a heater dielectric layer disposed on the adhesive layer, and an electrostatic dielectric layer, to which the wafer is adsorbed, disposed on the heater dielectric layer.

13. The electrostatic chuck assembly as claimed in claim 1, wherein the bottom portion has a ring shape, and wherein a radius of an inner diameter of the bottom portion ranges about 97.5% to about 98.5% of a radius of an outer diameter of the bottom portion.

14. The electrostatic chuck assembly as claimed in claim 1, wherein the coating layer comprises aluminum oxide.

15. An electrostatic chuck assembly comprising:

a lower electrostatic chuck;

a coating layer covering a part of the lower electrostatic chuck;

an adhesive layer formed on the coating layer;

a heater dielectric layer formed on the adhesive layer;

an electrostatic dielectric layer, to which a wafer is adsorbed, formed on the heater dielectric layer; and a base disposed on a lower surface of the lower electrostatic chuck, wherein the lower electrostatic chuck comprises a protrusion protruding toward the base and in contact with an upper surface of the base, and wherein the coating layer is disposed between the lower surface of the lower electrostatic chuck and the upper surface of the base, and comprises a bottom portion surrounding the protrusion.

16. The electrostatic chuck assembly as claimed in claim 15, wherein a cavity is formed between the protrusion and the bottom portion.

17. The electrostatic chuck assembly as claimed in claim 15, wherein a thickness of the protrusion is greater than a thickness of the bottom portion.

18. The electrostatic chuck assembly as claimed in claim 15, further comprising an insulating structure disposed between the protrusion and the bottom portion and surrounding an edge of the bottom portion.

19. The electrostatic chuck assembly as claimed in claim 15, wherein the coating layer covers a part of an upper surface, a side surface, and the lower surface of the lower electrostatic chuck, and wherein a thickness of the coating layer is constant.

20. A semiconductor manufacturing apparatus comprising:

a chamber in which a plasma process is performed;

an electrostatic chuck assembly disposed inside the chamber and configured to support a wafer; and a control unit configured to control the electrostatic chuck assembly, wherein the electrostatic chuck assembly comprises:

an upper electrostatic chuck comprising an upper surface on which the wafer is adsorbed;

a lower electrostatic chuck disposed below the upper electrostatic chuck and supporting the upper electrostatic chuck;

a base disposed below the lower electrostatic chuck and supporting the lower electrostatic chuck; and a coating layer comprising an upper surface portion disposed on an upper surface of the lower electrostatic chuck, a side portion disposed on a side surface of the lower electrostatic chuck, and a bottom portion disposed on a part of a lower surface of the lower electrostatic chuck, wherein the lower surface of the lower electrostatic chuck comprises a first surface in contact with an upper surface of the base, and a second surface, on which the bottom portion is disposed, spaced apart from an upper surface of the base, and wherein the bottom portion is disposed horizontally apart from the first surface.

* * * * *